United States Patent [19]

Money

[11] Patent Number: 4,527,133
[45] Date of Patent: Jul. 2, 1985

[54] SELF-BALANCING CURRENT SOURCES FOR A DELTA MODULATOR

[75] Inventor: David K. Money, Pennant Hills, Australia

[73] Assignee: Telectronics Pty. Ltd., Lane Cove, Australia

[21] Appl. No.: 393,800

[22] Filed: Jun. 30, 1982

[51] Int. Cl.³ .............................................. H03K 13/22
[52] U.S. Cl. ................................. 332/11 D; 307/246; 307/261; 307/362; 328/151
[58] Field of Search ............... 307/228, 362, 359, 246, 307/261; 328/151; 332/11 D

[56] References Cited

U.S. PATENT DOCUMENTS 4,124,821 11/1978 Petr ....................................... 307/362
4,151,473 4/1979 Coleman et al. ...................... 307/246

Primary Examiner—John Zazworsky
Attorney, Agent, or Firm—Gottlieb, Rackman & Reisman

[57] ABSTRACT

A delta modulator for controlling time-domain processing of sensed signals, and particularly internal physiological signals. The delta modulator includes two constant current sources both of which are on continuously, but only one of which is connected to the input capacitor at any given time. The two constant current sources are self balancing. Periodically, the two current sources are connected simultaneously to a control capacitor, the potential across which is thus a function of the relative current source amplitudes. The potential across the control capacitor is used in a feedback circuit to control the amplitude of at least one of the current sources so that the two sources are made to have equal amplitudes. Preferably, the control capacitor is an on-chip capacitor whose effective capacitance is increased by the Miller effect.

14 Claims, 4 Drawing Figures

SELF-BALANCING CURRENT SOURCES FOR A DELTA MODULATOR

DESCRIPTION

This invention relates to delta modulators such as those used for time-domain processing of internal physiological signals, and more particularly to self-balancing current sources for use therein.

In the copending application of Money et al. entitled "Time-Domain Processing of Internal Physiological Signals", Ser. No. 320,338 filed on Nov. 12, 1981, which application is hereby incorporated by reference, there is disclosed a delta modulator which allows time-domain processing of internal physiological signals. The use of such a modulator permits digital processing of analog physiological signals, even in the input stage of a heart pacer, for example, rather than conventional frequency-domain processing. The input signal is converted to a bit stream which, in addition to being operated upon within the pacer, can be transmitted to an external monitor; the bit stream can be used to form an accurate reconstruction of the sensed signal.

The delta modulator disclosed in said copending application in effect tracks the analog signal being monitored. A continuous sequence of bit samples is generated, the two states of the bit samples representing changes in respective opposite directions in the sensed signal. If the input signal starts to change in one direction, an excess of bits of one value will be generated by the delta modulator; a change in the input signal in the opposite direction causes an excess of bits of opposite value to be generated. The input signal which is operated upon by the delta modulator can be reconstructed by causing a fixed-size step to be taken for each received bit sample, the direction of the step depending upon the bit-sample value. Once the input signal settle down to a quiescent level, and after the delta modulator has caught up to the input signal, bit samples of alternating values are generated. Successive bit samples of the same value are then generated only after the input signal starts to change. As long as the delta modulator operates at a fast enough rate, the reconstructed signal will accurately follow the input signal.

A delta modulator is also disclosed in the copending application of Money et al. entitled "Cardiac Event Recognition Techniques For Use With A Delta Modulator", Ser. No. 393,649, filed on June 30, 1982, which application is also hereby incorporated by reference.

In the delta modulators disclosed in the two above-identified Money et al. applications, the analog signal appears at an input terminal, and a bit sequence appears at the output terminal. The input signal is coupled through a capacitor to one input of a comparator, for example, the minus input; in such a case the plus input of the comparator is connected to a reference potential. Suppose, for example, that the input signal starts to decrease from some quiescent level. This tends to cause the potential at the minus input of the comparator to fall, and the output of the comparator switches to a respective state. This state of the output causes a first current source to control a current flow through the input capacitor which tends to restore the potential at the minus input of the comparator to the reference potential. In a similar manner, and in response to the modulator output being in the opposite state, another current source controls a current flow through the capacitor in the opposite direction when the input signal increases from a quiescent level. The entire operation is clocked so that output bit samples are derived at a constant rate, with output bits of different values causing equal-magnitude but oppositely poled voltage steps across the input capacitor. In the case of a constant or non-changing input, alternating 0 and 1 bit values appear at the delta modulator output.

The delta modulator does not function to cause the potential at the minus input of the comparator to track that at the input terminal. The comparator input is a virtual ground. What happens is that the input capacitor is charged and discharged by the two current sources so that the potential at the input terminal has added to it or subtracted from it a capacitor potential such that the resulting level at the minus input of the comparator equals the reference potential.

The use of two constant current sources in a delta modulator presents two problems. The first relates to switching of the current sources. One or the other of the two current sources causes a current to flow through the input capacitor. If when one current source is connected to the input capacitor the other current source is held off, it requires some finite time for current to begin to flow from the previously off source when it is switched on to cause an oppositely directed current to flow through the capacitor. If the current sources have to be switched on and off in this manner, the system must necessarily be operated at a slower rate and this affects the accuracy of the tracking of the input signal. One of the advantages of the delta modulators disclosed in the two above-identified applications is that each of the two current sources is always on. When one of the two sources is not connected to the input capacitor, its current is caused to flow through an alternate path. Thus no time is wasted in turning on one of the current sources when it must be connected to the input capacitor. All that is required is to switch the current paths of the two sources.

The other problem is that the two current sources will not be perfectly matched. What this means is that one of the current sources will have to be connected to the input capacitor more often than the other in order to control the same total voltage change across the capacitor (albeit in opposite directions). This is equivalent to an input slope error. If the signal which is reconstructed from the bit samples at the output of the delta modulator is to track the input signal accurately, it is necessary that the two current sources be equal in magnitude.

It is a general object of my invention to provide a circuit which automatically controls the two current sources of a delta modulator to be equal in amplitude.

Briefly, in accordance with the principles of my invention and in the illustrative embodiment thereof, I provide an additional capacitor to which periodically both current sources are connected simultaneously. The voltage across this capacitor is necessarily a function of the mismatch in the two current source amplitudes. The voltage across the capacitor is used to control the amplitude of at least one of the two current sources. The feedback arrangement is such that the voltage across the capacitor changes only very slowly to hold the two current sources equal in amplitude. For reasons which will become apparent below, it would appear that a large control capacitor would be required for this purpose, thereby making it difficult to implement the overall circuit in integrated-circuit form. However, in the preferred embodiment of my invention a large capacitor is not required. The effective capacitance of an on-chip capacitor is increased by a form of "Miller effect" multiplication.

Further objects, features and advantages of my invention will become apparent upon consideration of the following detailed description in conjunction with the drawing, in which.

Figure 1:
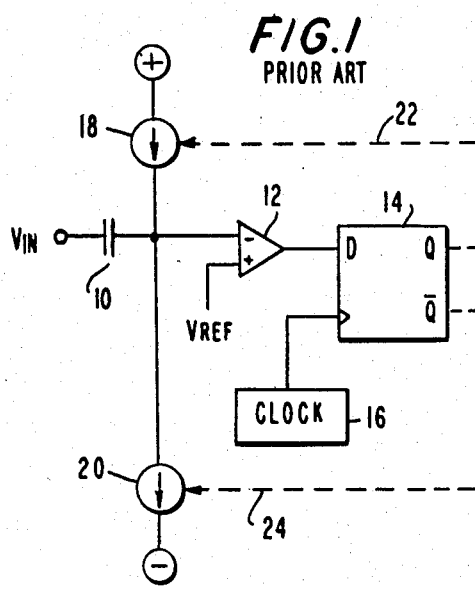
FIG. 1 depicts schematically the general form of a prior art delta modulator.

In the prior art circuit of FIG. 1, two current sources 18, 20 are connected to the right side of input capacitor 10. The input signal is applied to the left side of the capacitor, and the junction of the capacitor and the two current sources is connected to the minus input of comparator 12. A reference potential is applied to the plus input of the comparator. Periodically, flip-flop 14 is clocked at a rate determined by clock 16. Since the output of the comparator is connected to the D input of the flip-flop, the flip-flop assumes a state dependent upon whether the output of the comparator is high or low. A high output causes the flip-flop to be set, the Q output to be high, and the $\bar{Q}$ output to be low. Dashed line 22 represents the turning on of current source 18 when the Q output is high, and dashed line 24 represents the turning on of current source 20 when the $\bar{Q}$ output is high. Only one of the two current sources is turned on at any given time, depending upon whether the potential at the right side of capacitor 10 tends to increase above the reference potential or to decrease below it. The net effect is that the minus input of the comparator is returned to a potential equal to the reference potential. The state of the flip-flop represents whether the input signal is tending to increase or decrease. By forming a signal which consists of equal-size steps in two opposite directions, depending upon the instantaneous state of the flip-flop, and causing the steps to occur at the rate of clock 16, the signal thus formed will track the input signal—as is described in the two above-identified copending Money et al. applications.

Although current sources 18, 20 in FIG. 1 serve to charge and discharge input capacitor 10 so that the potential at the minus input of comparator 12 is maintained equal to the reference potential applied to the plus input of the comparator, the rate at which the delta modulator can be operated is limited by the time required to turn one current source off and the other one on. The improved system of FIG. 2 (whose principles of operation are also disclosed in said Money et al. applications) can operate at a faster rate. The two outputs of the flip-flop no longer control respective current sources to turn on or off. Instead, both of current sources 18, 20 are always on. The two outputs of the flip-flop now control the positions of respective switches 30, 32. With the switch positions shown in the drawing, switch 30 is connected to terminal 30b, and current source 18 causes a current to flow from right to left through input capacitor 10. Although current source 20 is not utilized to cause a current flow through the input capacitor, current nevertheless continues to flow through this current source. Switch 32 is connected to terminal 32b, and current source 20 simply causes current to flow from the positive supply to the negative supply.

When current source 20 is to become operative instead of current source 18, that is, when the $\bar{Q}$ output of flip-flop 14 goes high, both of switches 30, 32 change positions. With switch 32 connected to terminal 32a, current source 20 causes a left-to-right current flow through input capacitor 10. Current source 18 is now connected by switch 30 to terminal 30a, and thus the current source remains on with current simply flowing between the positive and negative supplies. It is thus apparent that by using the flip-flop outputs to control steering of the two currents instead of actually controlling the current sources to turn on and off, it is not necessary to operate the system at a slower rate which would allow current to build up in either current source when it is first turned on. Instead, both current sources are always on.

Figure 2:
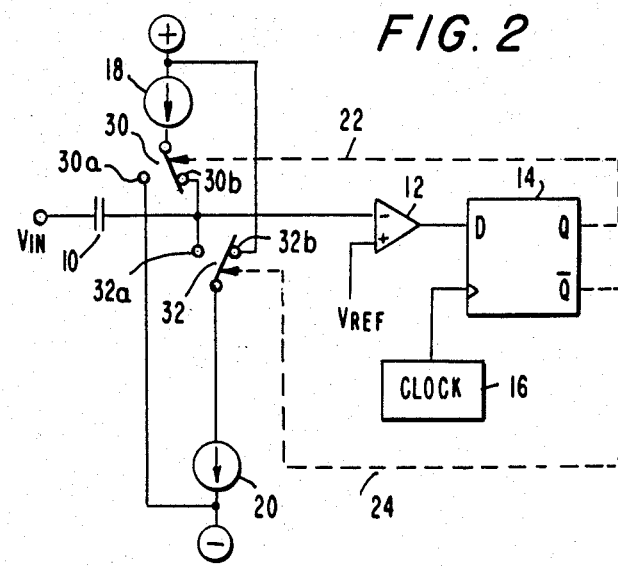
FIG. 2 depicts the manner in which two "always-on" current sources can be used to allow a delta modulator to operate at a fast rate.

It is to be understood that while mechanical switches are depicted in FIG. 2 (and in FIG. 3), these mechanical switches are symbolic only. In an actual circuit implementation, electronic switches should be employed, such switches being well known in the art.

The system of FIG. 2 does not solve the current mismatch problem. Suppose, for example, that one of the current sources is ten percent larger in magnitude than the other. What this means is that for equal changes in the input signal in opposite directions, one of the current sources will be connected to the input capacitor eleven times while the other current source is connected to the input capacitor only ten times. The circuit used to form the signal which tracks the input causes the signal to change in discrete fixed-size steps, in directions depending upon the state of flip-flop 14, at periodic clock intervals. This would necessarily result in a larger overall change in one direction than in the other even though the input signal may change equally in the two directions. While passing the signal thus formed through a capacitor would filter out slow changes and thus prevent long-term errors in the reconstructed signal, the reconstructed signal would not track the input signal accurately on a short-term basis. It is for this reason that accuracy demands that the two current sources be equal in amplitude.

Figure 3:
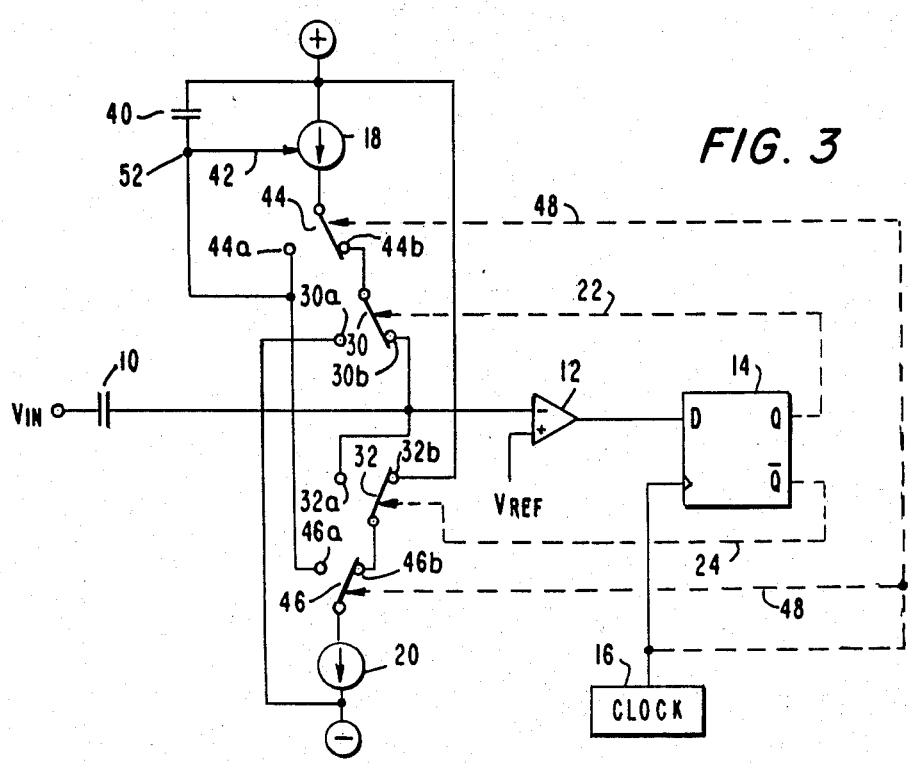
FIG. 3 depicts the illustrative embodiment of my invention for controlling self-balancing of the two current sources.

The system of FIG. 3 includes two additional switches 44, 46. Ordinarily, both of the switches are in the positions shown, connected respectively to terminals 44b, 44b. When the two switches are in these respective positions, the system operates just as does the system of FIG. 2. At intervals determined by clock 16, flip-flop 14 changes state and causes switches 30, 32 to assume the positions shown, or the opposite pair of positions.

Pulses at the output of clock 16 are applied to the dashed lines 48, which represent a control exerted over switches 44, 46. Whenever the clock signal goes low, switch 44 is connected to terminal 44a, and switch 46 is connected to terminal 46a. During this clock low interval, current flows through neither of switches 30, 32 and thus the potential across capacitor 10 remains unchanged. (It is also possible to thus operate switches 44, 46 at a rate lower than that of clock 16, for example, by utilizing a counter to divide the clock frequency.)

With switches 44, 46 connected respectively to terminals 44a, 46a, it will be seen that both current sources are connected to node 52. If current source 18 is larger in magnitude than current source 20, not all of the current from source 18 will flow through source 20. The excess current from source 18 will flow from terminal 44a to node 52, and through capacitor 40 back to current source 18. This causes capacitor 40 to charge with node 52 tending to become more positive. On the other hand, if source 20 is larger in magnitude than source 18, the additional current which flows through source 20 must be derived from node 52, current thus flowing from the positive supply down through capacitor 40, resulting in node 52 becoming more negative. The net effect is that node 52 assumes a potential whose polarity with respect to a reference voltage depends upon which of the two current sources is larger, and whose magnitude depends upon the degree of mismatch. The potential at node 52 is used to control the magnitude of current source 18. (Voltage controlled current sources are well known to those skilled in the art.) If node 52 tends to become higher in potential, the amplitude of current source 18 is decreased. Since the node becomes higher in potential as a result of current source 18 being larger in magnitude than current source 20 in the first place, it is apparent that the feedback circuit for controlling current source 18 tends to lower the magnitude of this current source to match that of current source 20. Conversely, if current source 20 is larger in magnitude than current source 18, node 52 becomes lower in potential, thus tending to cause current source 18 to increase in magnitude and to equal that of current source 20.

It should be apparent that the potential at node 52 is a function of the integral of the difference between the two current source amplitudes. Once the potential at node 52 is set to control equal-magnitude current sources, the potential will remain unchanged except as a result of small internal leakage currents at node 52. During the clock high interval when switches 44, 46 are in their respective positions shown in FIG. 3, the current sources may become mismatched as the potential at node 52 changes slighly. The mismatch which can arise is dependent upon the time interval between successive simultaneous connections of the two current sources to node 52, and the leakage current at the node. The mismatch which can arise is inversely proportional to the capacitance at node 52; the larger the capacitance, the smaller the potential change at node 52 due to the internal leakage currents.

There is little need for the potential at node 52 to change rapidly when the two current sources are connected to node 52, since sudden mismatches are unlikely. Because there is no need to allow for rapid changes in the potential of node 52, and the node voltage should remain constant between samplings, capacitor 40 should be as large as possible.

It is difficult to fabricate a large capacitor in an integrated circuit. A large discrete capacitor 40 can be used by extending node 52 from the integrated circuit to an external capacitor. The problem with this approach, however, is that while the leakage currents from node 52 would ordinarily be very small if the node is internal to the chip, connecting the node to an external capacitor would greatly increase the leakage because the node would be exposed to the "outside world". To prevent a mismatch from arising between successive samplings, it is of course necessary that leakage currents be held to a minimum. A mismatch also arises directly due to any leakage on node 52. For this reason, in the preferred embodiment of the invention, capacitor 40 in FIG. 3 is replaced by the circuit of FIG. 4; in FIG. 3 capacitor 40 is connected between the positive supply and node 52, and in FIG. 4 the various elements shown are similarly connected between the same two points. It is to be understood, of course, that all of the elements of FIG. 4 are fabricated on the integrated circuit which includes the remainder of the system of FIG. 3.

Figure 4:
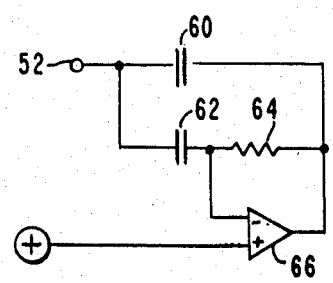
FIG. 4 depicts the manner in which Miller-effect multiplication can be used to avoid the need for a large-value capacitor in the circuit of FIG. 3.

The circuit of FIG. 4 allows the apparent capacitance at node 52 to be very large with the use of two on-chip capacitors 60, 62, a resistor 64, and a difference amplifier 66, all arranged to provide a form of Miller-effect multiplication. Capacitor 62, resistor 64 and difference amplifier 66 together provide some gain A in the frequency range of interest (the frequency range which characterizes how fast the voltage at node 52 changes). The gain is negative due to the connection of the junction of capacitor 62 and resistor 64 to the minus input of difference amplifier 66. Suppose, for example, that node 52 rises in potential. The voltage across capacitor 60 increases even more, by a factor of (1+A); the left side of the capacitor increases directly due to the increase in the potential at node 52 and the right side of the capacitor decreases in potential by the gain from node 52 to the output of the difference amplifier. Thus the total potential change across capacitor 60 is equal to (1+A) times the change in potential at node 52. This means that capacitor 60 conducts (1+A) times the current that it normally would were it simply connected between node 52 and the positive supply. This, in turn, means that capacitor 60 exhibits a capacitance between the positive supply and node 52 which is actually (1+A) times its actual value. It is in this way that on-chip capacitors can be used to achieve a large effective value for capacitor 40 of FIG. 3.

Prior art circuits which utilize the Miller effect to advantage exhibit DC gain. It should be noted that there is no such gain in the circuit of FIG. 4 due to the provision of capacitor 62. Capacitor 62 is necessary because without it node 52 would either be held at the potential of the positive supply or amplifier 66 would not amplify as its output would saturate at the positive supply. While the circuit of FIG. 4 does not provide for any DC gain, it is desirable that the time constant of capacitor 62 and resistor 64 be large. With a small time constant, the gain A described above would be large only for higher frequencies, and what is required in the circuit of FIG. 3 is a large value of capacitance at low frequencies since the voltage at node 52 changes very slowly. One way to increase the time constant is to utilize a pair of back-to-back diodes instead of providing a resistor 64. With such an arrangement, the rate at which switches 44, 46 are operated can go as low as 10 Hz and still provide an effective gain A as high as about 10 (thus effectively multiplying the effective capacitance of capacitor 60 by about the same factor). Typically, switches 44, 46 are operated at 1 kHz or higher, with an effective gain A measured in the hundreds. In general, and as described above, the circuit of FIG. 4 is highly preferred in that it allows on-chip capacitors to be used to provide a relatively high capacitance value for capacitor 40 of FIG. 3.

Although the invention has been described with reference to a particular embodiment, it is to be understood that this embodiment is merely illustrative of the application of the principles of the invention. Numerous modifications may be made therein and other arrangements may be devised without departing from the spirit and scope of the invention.

I claim:

1. A delta modulator for operating on a sensed signal comprising capacitor means, means for applying said sensed signal to one side of said capacitor means, a first constant current source for charging said capacitor means, a second constant current source for discharging said capacitor means, means for comparing the potential on the other side of said capacitor means with a reference potential to periodically derive a bit sample the state of which represents the result of the most recent comparison, means for coupling either said charging constant current source or said discharging constant current source to said capacitor means in accordance with the state of each bit sample to control the potential across said capacitor means to track the potential of said sensed signal, only one of said constant current sources being coupled to said capacitor means at any instant of time, means for periodically developing a control signal whose amplitude is a function of the relative magnitudes of said two constant current sources, and feedback means for utilizing said control signal to control the amplitude of at least one of said constant current sources to equalize the magnitudes thereof.

2. A delta modulator in accordance with claim 1 wherein said control signal developing means includes a control capacitor, and means for periodically connecting both of said constant current sources simultaneously to said control capacitor to develop a potential thereacross which is a function of the relative amplitudes of said two constant current sources.

3. A delta modulator in accordance with claim 2 wherein the entire delta modulator is implemented in an integrated circuit, and said control capacitor includes an on-chip capacitor.

4. A delta modulator in accordance with claim 3 wherein said control signal developing means operates at a rate no higher than that of said comprising means.

5. A delta modulator in accordance with claim 2 wherein both of said constant current sources operate continuously.

6. A delta modulator in accordance with claim 1 wherein said control signal developing means operates at a rate no higher than that of said comparing means.

7. A delta modulator in accordance with claim 1 wherein both of said constant current sources operate continuously.

8. A delta modulator for operating on a sensed signal comprising capacitor means; means for applying said sensed signal to said capacitor means; a first constant current source for charging said capacitor means and a second constant current source for discharging said capacitor means, both for developing a capacitor potential; means for comparing said capacitor potential with a reference potential to periodically derive a big sample the state of which represents the result of the most recent comparison; means for coupling either said charging constant current source or said discharging constant current source to said capacitor means in accordance with the state of each bit sample to control the potential across said capacitor means to track the potential of said sensed signal; only one of said constant current sources being coupled to said capacitor means at any instant of time; means for periodically developing a control signal whose amplitude is a function of the relative magnitudes of said two constant current sources; and feedback means for utilizing said control signal to control the amplitude of at least one of said constant current sources to equalize the magnitudes thereof.

9. A delta modulator in accordance with claim 8 wherein said control signal developing means includes a control capacitor, and means for periodically connecting both of said constant current sources simultaneously to said control capacitor to develop a potential thereacross which is a function of the relative amplitudes of said two constant current sources.

10. A delta modulator in accordance with claim 9 wherein the entire delta modulator is implemented in an integrated circuit, and said control capacitor includes an on-chip capacitor.

11. A delta modulator in accordance with claim 10 wherein said control signal developing means operates at a rate no higher than that of said comparing means.

12. A delta modulator in accordance with claim 9 wherein both of said constant current sources operate continuously.

13. A delta modulator in accordance with claim 8 wherein said control signal developing means operates at a rate no higher than that of said comparing means.

14. A delta modulator in accordance with claim 8 wherein both of said constant current sources operate continuously.

* * * * *